(12) United States Patent
Bartling et al.

(10) Patent No.: US 11,791,207 B2
(45) Date of Patent: Oct. 17, 2023

(54) UNIT SPECIFIC VARIABLE OR ADAPTIVE METAL FILL AND SYSTEM AND METHOD FOR THE SAME

(71) Applicant: Deca Technologies USA, Inc., Tempe, AZ (US)

(72) Inventors: David Ryan Bartling, Mesa, AZ (US); Craig Bishop, Scottsdale, AZ (US); Timothy L. Olson, Phoenix, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 17/885,511

(22) Filed: Aug. 10, 2022

(65) Prior Publication Data
US 2023/0047504 A1  Feb. 16, 2023

Related U.S. Application Data

(60) Provisional application No. 63/232,949, filed on Aug. 13, 2021.

(51) Int. Cl.
| | | |
|---|---|---|
| *H01L 21/768* | (2006.01) | |
| *H01L 21/8234* | (2006.01) | |
| *H01L 23/31* | (2006.01) | |
| *H01L 23/532* | (2006.01) | |

(52) U.S. Cl.
CPC ............ *H01L 21/76877* (2013.01); *H01L 21/823475* (2013.01); *H01L 23/3178* (2013.01); *H01L 23/53271* (2013.01)

(58) Field of Classification Search
CPC ....... H01L 21/76877; H01L 21/823475; H01L 23/3178; H01L 23/53271
See application file for complete search history.

(56) References Cited

U.S. PATENT DOCUMENTS

| | | |
|---|---|---|
| 2015/0001717 A1 | 1/2015 | Karhade |
| 2016/0307870 A1 | 10/2016 | Kelly |
| 2016/0329257 A1 | 11/2016 | Scanlan |
| 2017/0103927 A1* | 4/2017 | Bishop ................ H01L 24/97 |
| 2020/0380197 A1 | 12/2020 | Park |
| 2021/0183677 A1 | 6/2021 | Choi |

* cited by examiner

*Primary Examiner* — Karen Kusumakar
(74) *Attorney, Agent, or Firm* — BOOTH UDALL FULLER, PLC; Bryce W. Burnham

(57) ABSTRACT

A method of forming a semiconductor device can comprise providing a first shift region in which to determine a first displacement. A second shift region may be provided in which to determine a second displacement. A unique electrically conductive structure may be formed comprising traces to account for the first displacement and the second displacement. The electrically conductive structure may comprise traces comprising a first portion within the first shift region and a second portion of traces in the second shift region laterally offset from the first portion of traces. A third portion of the traces may be provided in the routing area between the first shift region and the second shift region. A unique variable metal fill may be formed within the fill area. The variable metal fill may be electrically isolated from the unique electrically conductive structure.

20 Claims, 13 Drawing Sheets

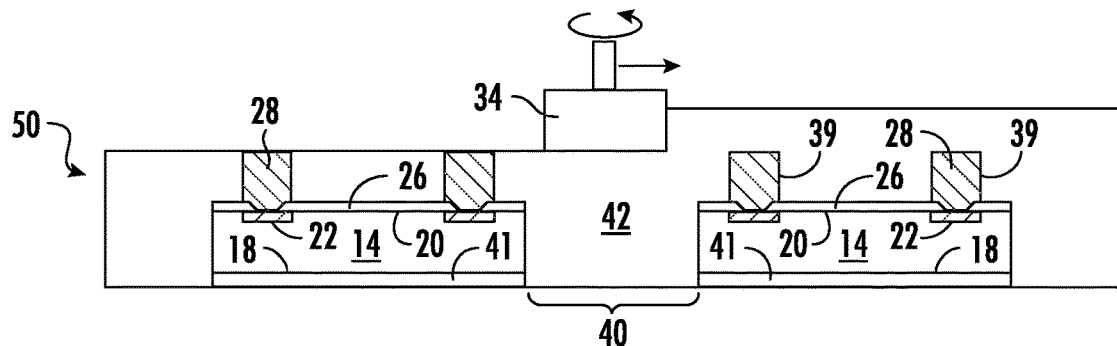
FIG. 1D
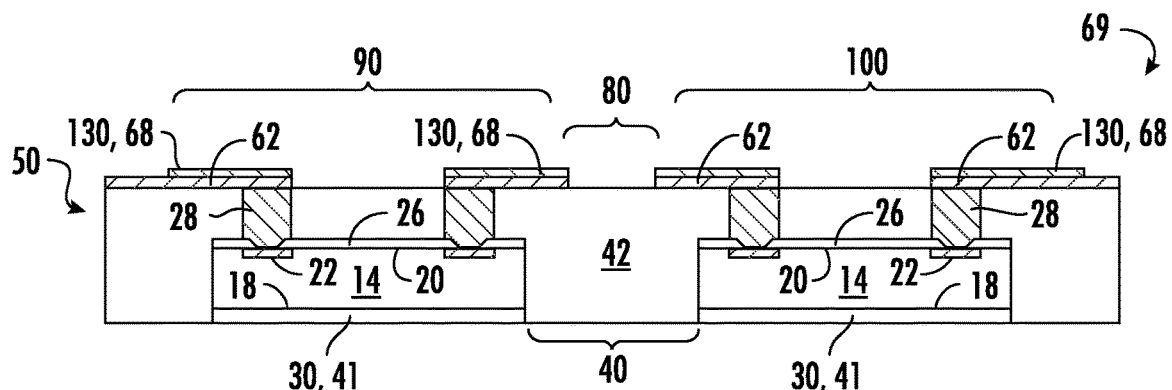
FIG. 1E
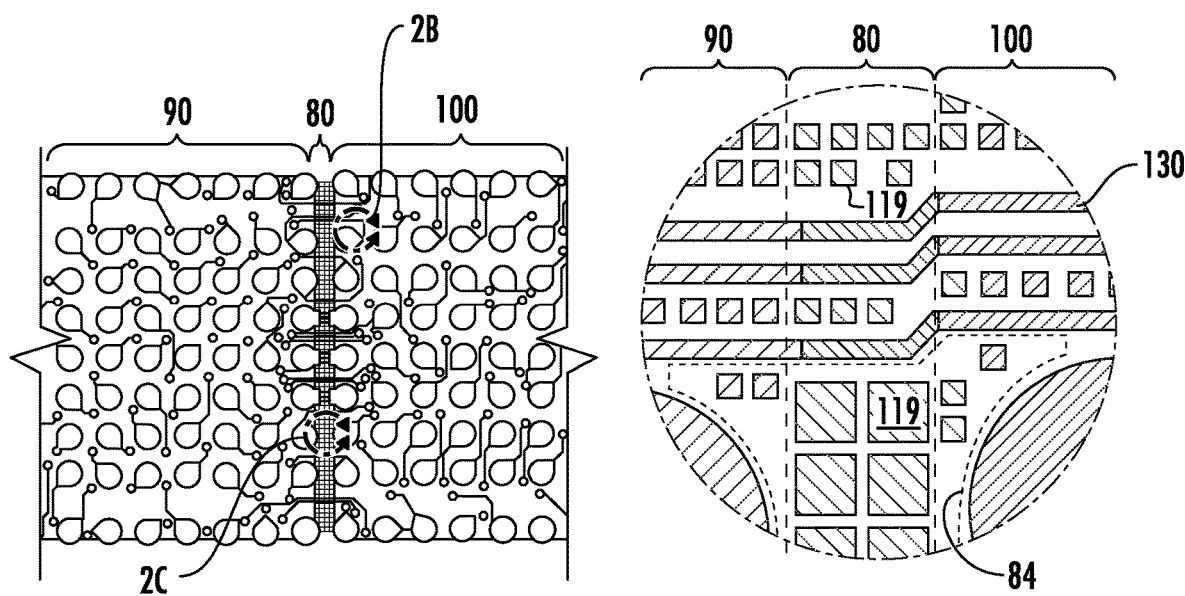
FIG. 2A
FIG. 2B

UNIT SPECIFIC VARIABLE OR ADAPTIVE METAL FILL AND SYSTEM AND METHOD FOR THE SAME

CROSS-REFERENCE TO RELATED APPLICATIONS

This disclosure claims the benefit, including the filing date, of U.S. Provisional Patent No. 63/232,949, entitled "Unit Specific Adaptive Metal Fill and System and Method for the Same," which was filed on Aug. 13, 2021, the entire disclosure of which is hereby incorporated herein by this reference.

TECHNICAL FIELD

The disclosure relates to unit specific variable metal fill, which is also known under the Deca Technologies tradename and trademark "Unit Specific Adaptive Metal Fill," "Adaptive Metal Fill"™ and "AMF"™ The disclosure relates to semiconductor devices, substrates, and packages, comprising unit specific variable metal fill, and systems and methods for the same.

BACKGROUND

Semiconductor devices, packages, substrates, and interposers are commonly found in modern electronic products. Substrates and interposers provide structural support and electrical interconnectivity for semiconductor devices, packages, chips, passive devices, and other devices, module, and units. Substrates include circuit boards and printed circuit boards (PCBs). PCBs may be configured or arranged in numerous ways, as is known in the art, whether single layer, double layer, multi-layer, high density interconnect (HDI), high frequency, formed with a core or without a core (coreless), with or without a mesh or glass weave reinforcement, rigid, flexible, rigid-flex, laminates, interposers, or any other substrate or support material).

Semiconductor devices vary in the number and density of electrical components. Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment, as well as in other fields and applications.

Semiconductor devices are generally manufactured using both front-end manufacturing, and back-end manufacturing. Front-end manufacturing involves the formation of a plurality of semiconductor die on the surface of a semiconductor wafer. Each semiconductor die can be identical and can contain circuits formed by electrically connecting active and passive components. Back-end manufacturing involves singulating individual semiconductor die from a finished wafer or wafers and packaging the die to provide structural support, electrical interconnect from the die to the next level such as a printed circuit board, electrical interconnect between multiple die or die and other components such as passive devices and finally, environmental protection.

SUMMARY

An opportunity exists for improved semiconductor manufacturing. Accordingly, in an aspect of the disclosure, a method of making a semiconductor device, may comprise providing a temporary carrier; disposing a first device comprising first interconnects over the carrier; disposing a second device comprising second interconnects over the carrier laterally offset from the first device; disposing encapsulant over and around the first device and the second device to form a first embedded device comprising a first shift region and a second embedded device comprising a second shift region; measuring a displacement of the first embedded device within the first shift region to determine a first displacement; measuring a displacement of the second embedded device within the second shift region to determine a second displacement; forming a variable region between and extending to the first shift region and the second shift region, the variable region further comprising a routing area, a relief area, and a fill area; forming a unique electrically conductive structure comprising traces to account for the first displacement and the second displacement, the traces comprising a first portion within the first shift region and a second portion of traces in the second shift region laterally offset from the first portion of traces and a third portion of the traces in the routing area between the first shift region and the second shift region; forming a unique non-conducting variable metal fill within the fill area, wherein the non-conducting variable metal fill is electrically isolated from the unique electrically conductive structure; and forming an insulating layer over the unique electrically conductive structure comprising traces and over the non-conducting variable metal fill disposed laterally between the first portion of traces and the second portion of traces.

The insulating layer may further comprise a lower surface in contact with the unique electrically conductive structure comprising traces and over the non-conducting variable metal fill; an upper surface of the insulating layer opposite the lower surface of the insulating layer, wherein the upper surface is substantially planar, such that the upper surface of the insulating varies in elevation less than 10 μm or less than a thickness of the insulating layer. The non-conducting variable metal fill is formed of a solid continuous material. The non-conducting variable metal fill may be formed of patterned non-continuous material comprising tiles and gaps between the tiles of the metal fill. The fill area may extends beyond the variable region into the first shift region, the second shift region, or both. The design space, a size, shape, or both the size and shape of a structure selected from one or more of the conductive patterned trace, and the non-conducting variable metal fill may be adjusted by decreasing a space between an original outer edge of the structure and a center of the structure by a fixed distance to form a reduced outer edge of the structure; and increasing the space between the reduced outer edge of the structure and the center of the structure by the fixed distance to form a new outer edge of the structure.

According to another an aspect of the disclosure, a method of making a semiconductor device may include providing a first shift region in which to determine a first displacement; providing a second shift region in which to determine a second displacement; forming a unique electrically conductive structure comprising traces to account for the first displacement and the second displacement, the electrically conductive structure comprising traces comprising a first portion within the first shift region and a second portion of traces in the second shift region laterally offset from the first portion of traces and a third portion of the traces in the routing area between the first shift region and the second shift region; and forming a unique variable metal fill within the fill area, wherein the variable metal fill is electrically isolated from the unique electrically conductive structure.

The method of making a semiconductor device may further include forming an insulating layer over the unique electrically conductive structure comprising traces and over the variable metal fill disposed laterally between the first portion of traces and the second portion of traces. A lower surface may be in contact with the unique electrically conductive structure comprising traces and over the variable metal fill; and an upper surface of the insulating layer opposite the lower surface of the insulating layer, wherein the upper surface is substantially planar, such that the upper surface of the insulating varies in elevation less than 10 µm or less than a thickness of the insulating layer. The variable metal fill may be formed of a solid continuous material. The variable metal fill may be formed of patterned non-continuous material comprising tiles and gaps between the tiles of the metal fill. The unique electrically conductive structure comprising traces may be electrically coupled to vias, under bump metallization (UBM) pads, or other electrically conductive structures. Adjusting, in design space, a size, shape, or both the size and shape of a structure selected from one or more of the conductive patterned trace, and the variable metal fill by: decreasing a space between an original outer edge of the structure and a center of the structure by a fixed distance to form a reduced outer edge of the structure; and increasing the space between the reduced outer edge of the structure and the center of the structure by the fixed distance to form a new outer edge of the structure.

According to another an aspect of the disclosure, a method of making a semiconductor device may include forming a semiconductor device, comprising providing a first shift region in which to determine a first displacement; forming a unique electrically conductive structure extending to the first shift region to account for the first displacement; and forming a unique variable metal fill, wherein the variable metal fill is electrically isolated from the unique electrically conductive structure.

The method of making a semiconductor device may further include forming an insulating layer over the unique electrically conductive structure comprising traces and over the variable metal fill. The insulating layer may further comprise: a lower surface in contact with the unique electrically conductive structure comprising traces and over the variable metal fill; and an upper surface of the insulating layer opposite the lower surface of the insulating layer, wherein the upper surface is substantially planar, such that the upper surface of the insulating varies in elevation less than 10 µm or less than a thickness of the insulating layer. The variable metal fill may be formed as solid continuous material that extends to the first shift region and the second shift region to form a conductive feature. The variable metal fill may be formed of patterned non-continuous material comprising tiles and gaps between the tiles of the metal fill. The unique electrically conductive structure may comprise traces electrically coupled to vias or vertical conductive interconnects, under bump metallization (UBM) pads, or other electrically conductive structures. A method may also include adjusting, in design space, a size, shape, or both the size and shape of a structure selected from one or more of the electrically conductive structure, and the variable metal fill by: decreasing a space between an original outer edge of the structure and a center of the structure by a fixed distance to form a reduced outer edge of the structure; and increasing the space between the reduced outer edge of the structure and the center of the structure by the fixed distance to form a new outer edge of the structure.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIGS. 1A-1E illustrate the formation of an embedded device.

FIGS. 2A-2C illustrate a device or fully molded semiconductor package including a variable region, a first shift region, and a second shift region.

DETAILED DESCRIPTION

Figure 1A:
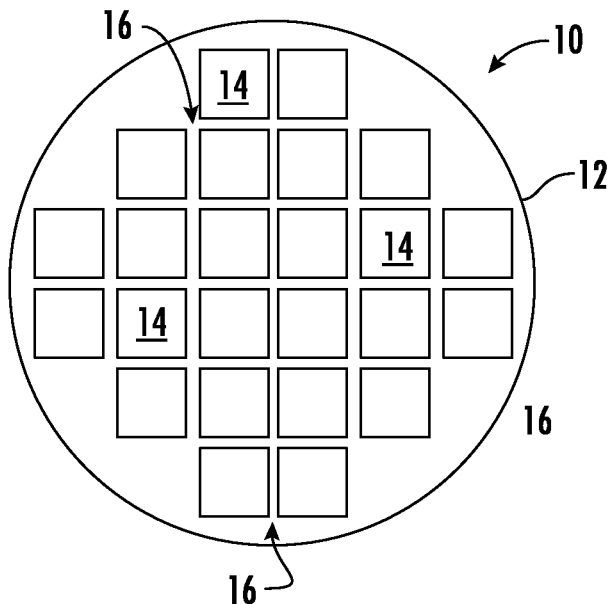

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the photoresist material are partially removed, so as to provide a pattern or electroplating template for the subsequent formation of structures, such as patterning redistribution layers (RDLs), under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle, masks or direct write imaging design file are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process, dry etch plasma dicing process, or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die (chiplets) to be connected with packaging technology to form a chiplet-based SoC (which is non monolithic) and provides a composite package with greater functionality. The chiplet approach may also decrease waste from defects, increase production efficiency, reliability, and performance. The chiplet approach also allows for heterogeneous integration, where devices built by different front-end processes can be integrated into a composite package.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIGS. 1A-1E illustrate the placement and arrangement of semiconductor die 14, which may further be arranged as embedded devices 50 within an encapsulant or mold compound 42. The embedded devices may be semiconductor die 14 singulated from a native semiconductor wafer 10. The embedded devices 14 may be placed on a temporary carrier or substrate with an encapsulant or mold compound 42 disposed therearound.

An embedded device comprises an active device, a semiconductor die comprising an active surface formed at the first surface, a semiconductor chip or chip, a bridge chip containing only routing layers without an active device, an integrated passive device (IPD), and a passive device. When the description refers to any of the above cited exemplary embedded devices, it is to be understood that any of the other embedded devices may also be used. As such, the references to semiconductor die 14 include any embedded device, as defined above.

FIG. 1A illustrates a semiconductor wafer or semiconductor substrate 10 with a base substrate material 12, such as, without limitation, silicon, glass, ceramic, germanium, gallium arsenide, indium phosphide, silicon carbide, or other materials, for structural support. A plurality of semiconductor die or components 14 is formed on wafer 10 separated by a non-active, inter-die wafer area or saw street 16 as described above. Saw streets 16 provide cutting areas to singulate semiconductor wafer 10 into individual semiconductor die 14.

Figure 1B:
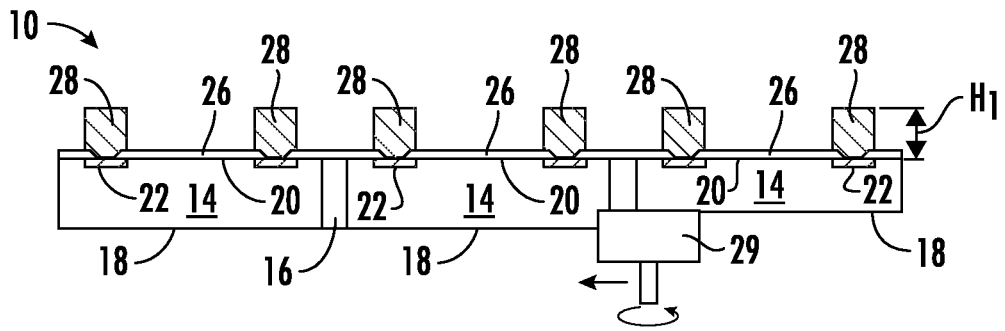

FIG. 1B illustrates a cross-sectional view of a portion of semiconductor wafer 10. Each semiconductor die 14 has a backside or back surface 18 and an active surface 20 opposite the backside. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Semiconductor die 14 may also contain IPDs such as inductors, capacitors, and resistors, for RF signal processing.

An electrically conductive layer or contact pads 22 is formed over active surface 20 using PVD, CVD, electrolytic plating, electroless plating process, or other suitable metal deposition process. Conductive layer 22 can be one or more layers of aluminum (Al), copper (Cu), tin (Sn), nickel (Ni), gold (Au), palladium (Pd), silver (Ag), or other suitable electrically conductive material. Conductive layer 22 operates as contact pads or bond pads electrically coupled or connected to the circuits on active surface 20. Conductive layer 22 can be formed as contact pads disposed side-by-side at a first distance from the edge of semiconductor die 14, as shown in FIG. 1B. Alternatively, conductive layer 22 can be formed as contact pads that are offset in multiple rows such that a first row of contact pads is disposed a first distance from the edge of the die, and a second row of contact pads alternating with the first row is disposed a second distance from the edge of the die.

FIG. 1B also illustrates the semiconductor substrate 10 and semiconductor die 14 can undergo an optional grinding operation with grinder 29 to planarize the backside 18 and reduce a thickness of the semiconductor substrate 10 and semiconductor die 14.

Figure 1C:
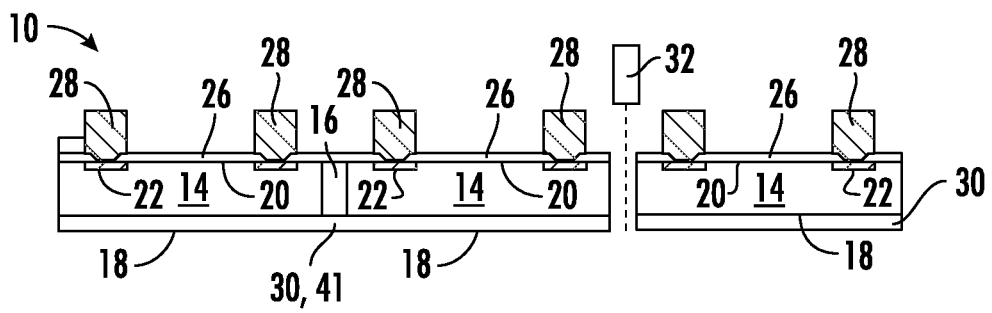

FIG. 1C shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1C shows electrical interconnect structures 28 can be formed as copper columns, copper pillars, or copper posts and are disposed over, and coupled or connected to, contact pads 22. The interconnect structures 28 can be formed directly on contact pads 22 using patterning and metal deposition processes such as printing, PVD, CVD, sputtering, electrolytic plating, electroless plating, metal evaporation, metal sputtering, or other suitable metal deposition process. Interconnect structures 28 can be one or more layers of Al, Cu, Sn, Ni, Au, Ag, palladium (Pd), or other suitable electrically conductive material and can include one or more UBM layers. In an embodiment, a photoresist layer can be deposited over semiconductor die 14 and contact pads 22. A portion of the photoresist layer can be exposed and removed by an etching development process. Electrical interconnect structures 28 can then be formed as copper pillars in the removed portion of the photoresist and over contact pads 22 using a selective plating process. The photoresist layer can be removed leaving interconnect structures 28 that provide for subsequent mechanical and electrical interconnection and a standoff with respect to active surface 20 and insulating layer 26, if present. Preferably, interconnect structures 28 include a height H1 in a range of 10-100 micrometers (μm), 5-50 μm, or about 25 μm.

FIG. 1C further illustrates an optional die attach film or material (DAF) 30 may be attached to the back surface 18 of the semiconductor die 14, such as for subsequent mounting on a carrier. FIG. 1C also illustrates wafer 10 can also be singulated with a saw or wafer cutting tool 32 into individual semiconductor die 14 through saw streets 16 using a saw blade or laser cutting tool either before or after subsequent processing to the semiconductor die 10 and to the semiconductor die 14.

FIG. 1D illustrates semiconductor die 14 disposed within, and forming part of, a panel or embedded die panel 50. An adhesive 41 can optionally be disposed on a backside 18 of semiconductor die 14. The adhesive 41 can be thermal epoxy, epoxy resin, B-stage epoxy film, ultraviolet (UV) B-stage film with optional acrylic polymer, or other suitable material. In an embodiment, the adhesive 41 can be disposed over backside 18 before semiconductor die 14 are mounted over, or to, a temporary carrier that can be used in the formation of embedded die panel 50. In some instances, adhesive 41 can be the same as DAF 30. In some instances, the adhesive 41 may extend over an entire surface (or most of an entire surface) of the embedded die panel 50, and in other instances may be disposed over the semiconductor die 14 and not over the embedded die panel 50.

The semiconductor die 14 can be separated by a space or gap 40 that may serve as a variable region, routing area, or Custom Routing Region ("CRR") 80 (which includes the CRR under the trademark or service mark "Adaptive Routing Region"™ or "ARR"™). The space 40 may provide an area for a subsequently formed fan-out interconnect structure and for variable metal fill 110, which is described in greater detail hereinafter. A size of gap 40 includes sufficient area for optionally mounting semiconductor devices or components to be included within a final semiconductor device or package, such as a FOWLP. A portion of the space 40 can be maintained and filled between the semiconductor die 14 with an encapsulant 42 that can be deposited using a paste printing, compression molding, transfer molding, liquid encapsulant molding, lamination, vacuum lamination, spin coating, or other suitable applicator. The encapsulant 42 can be a polymer composite material, such as epoxy resin with filler, epoxy acrylate with filler, or polymer with proper filler. The encapsulant 42 can be formed as a single material that is disposed over and around semiconductor die 14 and electric interconnect structures 28. The encapsulant 42 can be in contact with sidewalls 39 of the electric interconnect structures 28 and also be disposed between the interconnect structures 28.

The panel 50 can optionally undergo a curing process to cure the encapsulant 42. The panel 50 can include a footprint or form factor of any shape and size. In some instances, the panel 50 can include a form factor similar to the form factor of the substrate 10, such as a 300 millimeter (mm) semiconductor wafer and includes a circular footprint having a diameter of 300 mm. The panel 50, like substrate 10, can be of any desirable size or shape such as circular, square, such as 600 mm×600 mm, or rectangular, that can be formed of any desirable size.

FIG. 1D also shows the panel 50 can undergo an optional grinding operation with grinder 34 to planarize the surface and reduce a thickness of the panel. A chemical etch can also be used to remove any potential metallic contamination on the encapsulant and create a slight recess in interconnect 28 with respect to the planarized encapsulant 42 in the panel 50. Thus, a surface of interconnect structures 28 can be exposed with respect to encapsulant 42 at an outer surface or periphery of the panel 50 to provide for electrical connection between the semiconductor die 14 and a subsequently formed interconnect structure, such as a fan-out interconnect structure.

FIG. 1E shows a cross-sectional view of a portion of panel 50 in which conductive layer 68 is patterned and deposited over encapsulant 42, interconnects 28, and seed layer 62, to form RDLs as part of an interconnect structure. The conductive layer 68 can be one or more layers of Al, Cu, Sn, Ni, Au, Ag, or other suitable electrically conductive material. The depositing or formation of conductive layer 68 can use wafer-like processing that uses the seed layer 28 as part of an additive process on a molded panel, such as PVD, CVD, electrolytic plating, electroless plating, or other suitable process. In an embodiment, conductive layer 68 is formed over seed layer 62 by a plating process that uses conductive layer 62 as a plating surface. The conductive layer 68 can provide electrical interconnection between electrical interconnect structures 28 and subsequently formed bumps or package interconnect structures that provide for the transmission of electrical signals between the semiconductor die 14 with other semiconductor die, other components and points external to a final semiconductor package. Conductive layer 68 further comprises a unique electrically conductive pattern, a trace, redistribution layers (RDLs), various shapes or features across multiple layers, including a box shield (for shielding interference and undesired RF or EM signals), conductive interconnects or studs stacked and interconnecting with or without routing or RDLs, inductors, antenna, as well as power delivery and thermal dissipation structures. The conductive layer 130 may also be formed over insulating layers, such as insulting layer 77 shown in FIG. 4B and be coupled with vias 74 formed through the insulating layer, including polymer vias.

FIG. 1E also illustrates a first shift region 90, a second shift region 100, and a variable region 80 disposed between the first shift region and the second shift region 100. The shift regions 90, 100 may reflect shift that comes from process variation, imprecision, or unexpected or unaccounted for movement, such as in placement of die 14 in a pick and place operation, shift or movement of die 14 from molding or placement of encapsulant 42, or from any other process, procedure or factor.

Figure 2C:
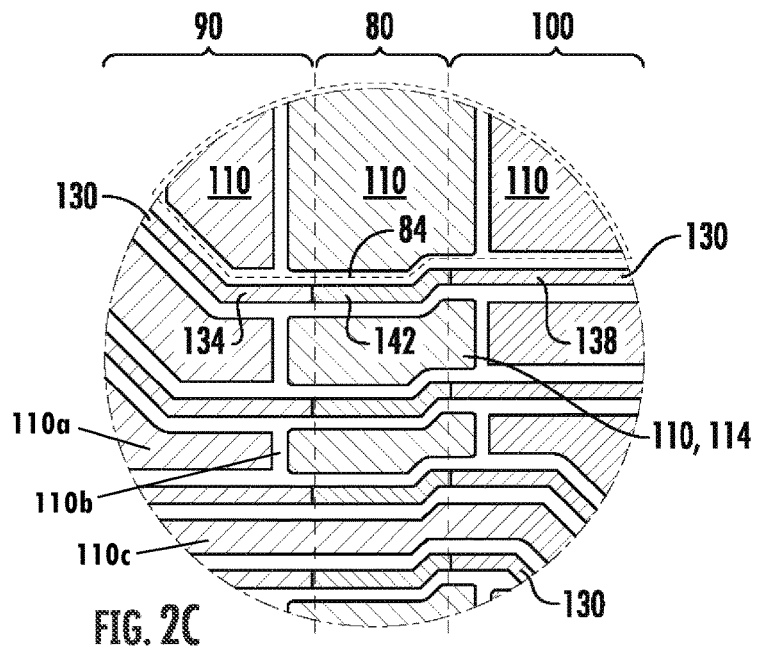
Figure 3A:
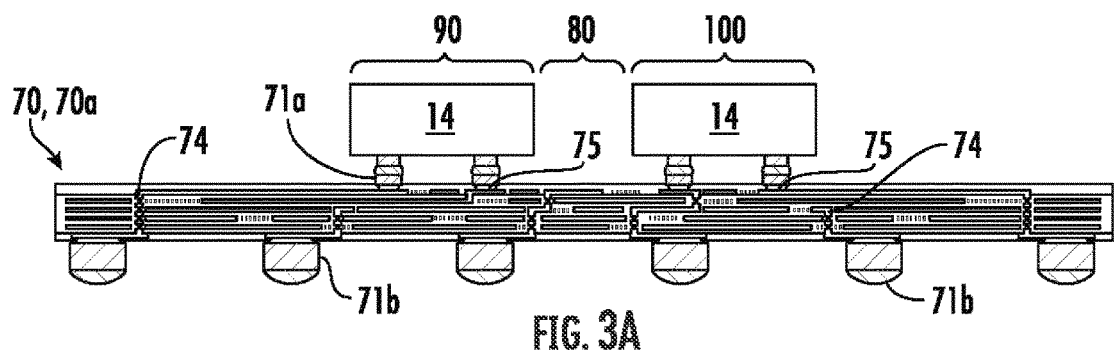
FIGS. 3A and 3B illustrate substrates or molded substrates including a variable region, a first shift region, and a second shift region.
Figure 3B:
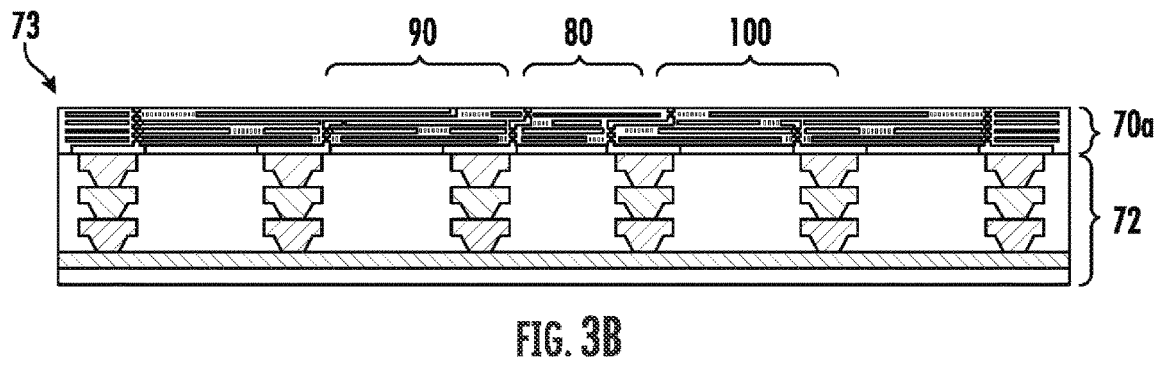

FIGS. 2A-2C illustrate a plan view, which could be a plan view of the semiconductor device or package 69 from FIG. 1E, or a substrate or interposer 70, as shown in FIGS. 3A and 3B. FIG. 2A further illustrates a first shift region 90, a second shift region 100, and a variable region 80 disposed between the first shift region and the second shift region 100. The variable region 80 may further comprise a routing area 82 and comprise a fill area 84. The routing area 82 may be reserved for, or comprise traces, conductive material, patterned material, unique electrically conductive structure 68, 130. The fill area 84 may receive the VMF or AMF™ 110. In some instances, a routing relief area (RRA) 86 may be an area that equal to or less than an area of the routing area 82, such as being a subset of the routing area 80, to accommodate for different amounts of shift or rerouting, as shown, e.g., in FIGS. 5A-6C. In some instances, routing relief areas (RRAs) 86 may result from grouping traces between rows of capture pads or other vertical interconnects, e.g. the traces on the left 134 and right 138 in FIG. 5A. The routing relief area 86 between traces 68, 130 can become fill area 84 and may receive a variable metal fill VMF 110. The shift regions 90, 100 may correspond with embedded devices, like the left and right semiconductor die 14 shown in FIG. 1E and 130 shown in FIGS. 5A-8H.

FIG. 2B illustrates a close-up or enlarged plan view of the portion of FIG. 2A indicated by the section line 2B.

FIG. 2C illustrates a close-up or enlarged plan view of the portion of FIG. 2A indicated by the section line 2C. FIG. 2C also illustrates instances where the VMF 110 is formed of discrete portions or islands 110a, separated by gaps or spaces 110b. In such instances, the VMF may be non-conductive and provide, e.g., structural support or fill for subsequently formed layers or other features. In other instances, the VMF 110 may be formed as solid continuous material 110c that extends to the first shift region and the second shift region to form a conductive feature, which may be connected at each end, and include, e.g., a power plane, a ground plane, or another desired structure.

FIG. 3A illustrates a substrate or interposer 70 that may comprise a molded substrate 70a comprising top side pads 71a and bottom side bumps 71b for subsequent interconnects such as with other semiconductor devices, packages, semiconductor die 14, and substrates. FIG. 3A illustrates the molded substrate 70a with a flip-chip devices 14. The molded substrates 70a may have been formed or built up over a temporary carrier that was subsequently removed. FIG. 3A also illustrates that the substrate 70 or molded substrate 70a may comprise vias 74 in the case of conventional build-up structures and vertical conductive interconnects 74a in the case of molded substrate 70a, that may be coupled with the unique electrically conductive structure 130. The substrate 70 or molded substrate 70a may comprise under bump metallization (UBM) pads 75.

FIG. 3B illustrates how the molded substrate 70a may be formed on or over another conventional substrate 70, such as a PCB 72 or other laminate material that may or may not comprise polyimide, which will remain (permanently) attached for structural support and additional connectivity to form a hybrid substrate 73.

As illustrated in FIGS. 3A and 3B, the substrates 70, PCBs 72, and hybrid substrates 73 may comprise a first shift region 90, a second shift region 100, and a variable region 80 disposed between the first shift region and the second shift region 100. The variable region 80 may further comprise a routing area 80 and comprise a fill area 84. The routing area 80 may be reserved for, or comprise traces, conductive material, patterned material, unique electrically conductive structure 68, 130. The fill area 84 may receive the VMF or AMF™ 110. In some instances, a routing relief area (RRA) 86 may be an area that equal to or less than an area of the routing area 82, such as being a subset of the routing area 80, to accommodate for different amounts of shift or rerouting, as shown, e.g., in FIGS. 5A-6C. The routing relief area 86 between traces 68, 130 can become fill area 84 and may receive a VMF 110. Within the substrates 70, PCBs 72, and hybrid substrates 73 as well as within semiconductor device or packages 69, multiple layers (such as vertically offset or separated layers) of AMF 110 may be formed or used for stacked or layered routing or other package design, structure, or interconnects.

Figure 4A:
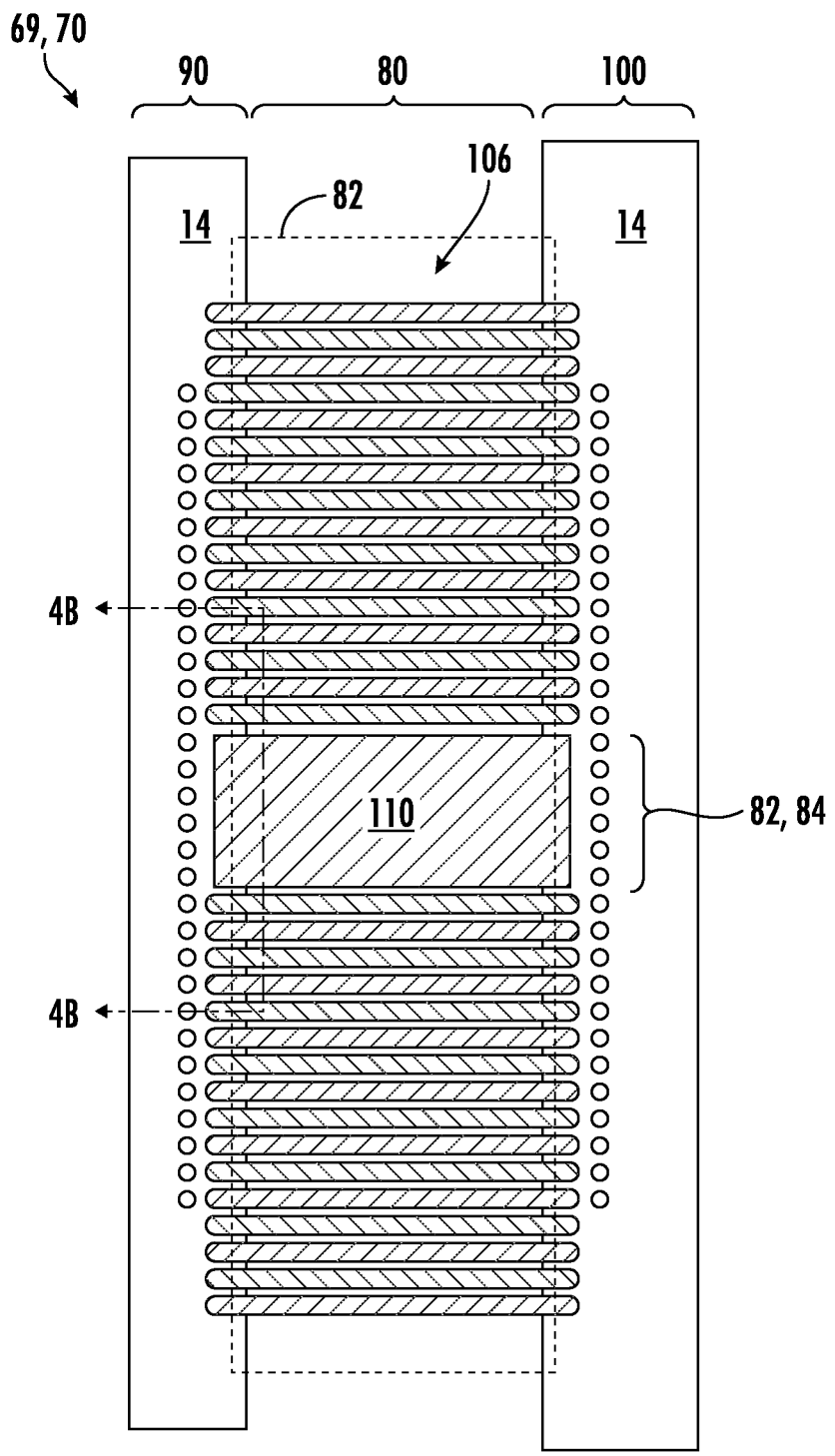
FIGS. 4A-4C illustrate various views of conductive interconnects with and without medal fill for support.
Figure 4B:
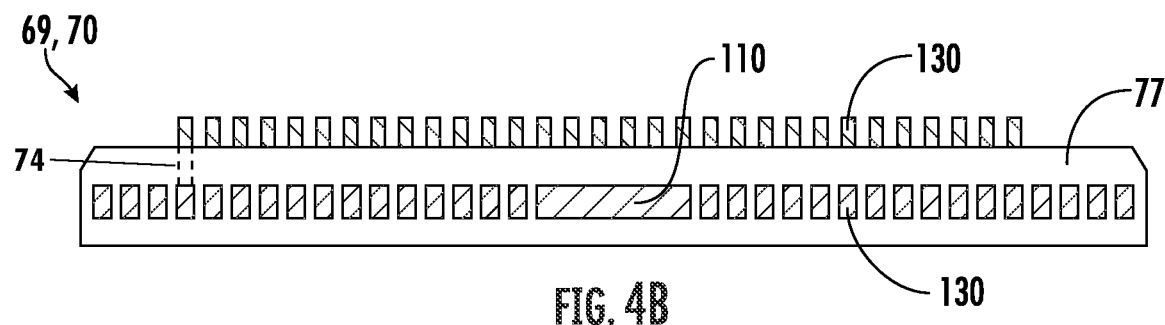
Figure 4C:
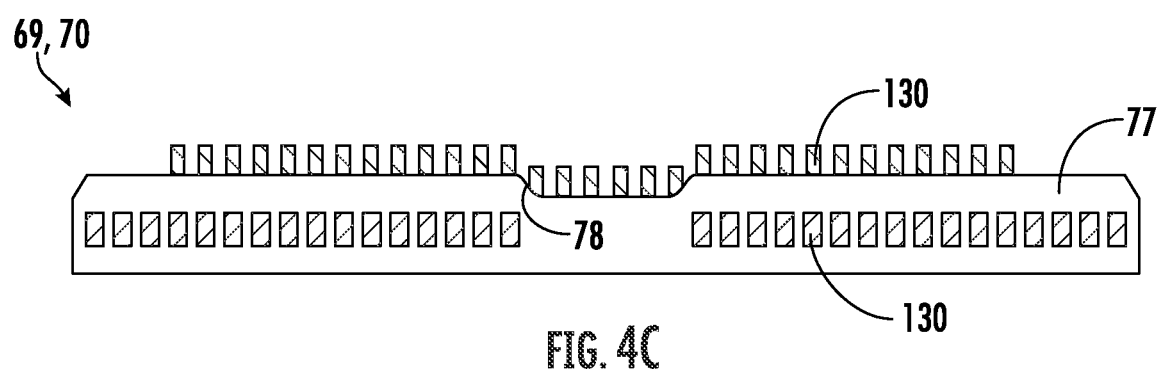

FIGS. 4A-4C illustrate various views of electrically conductive structures 130 formed as traces or RDLs with and without metal fill 110 for structural support. FIG. 4A illustrates a plan view of the first shift region 90, the second shift region 100, and the variable region 80 disposed adjacent the first shift region 90, adjacent the second shift region 100, and disposed between the first shift region 90 and the second shift region 100. the metal fill and RDLs that extend between the first shift region and the second shift region. FIG. 4A, illustrates how the first shift region 90, the second shift region 100, and the variable region 80 may interact and facilitated the variable metal fill 110 for both semiconductor devices 69, substrates 70, and other devices as shown, e.g., in FIGS. 1E-3B.

FIG. 4B illustrates a cross-sectional side or profile view taken from FIG. 4A along section line 4B, with the variable metal fill 110 being present. FIG. 4B shows an insulating or passivating layer 77 disposed over the variable metal fill 110 and over and around the conductive material 130. Insulating layer 77 can include one or more layers that are applied using PVD, CVD, screen printing, spin coating, spray coating, sintering, thermal oxidation, or other suitable process. Insulating layer 77 can contain, without limitation, one or more layers of $SiO_2$, $Si_3N_4$, SiON, $Ta_2O_5$, $Al_2O_3$, polymer, polyimide, BCB, PBO, molding compound, polymer composite material, such as epoxy resin with filler, epoxy acrylate with filler, or polymer with proper filler, any suitable dielectric, or other material having similar insulating and structural properties. The insulating layer 77 may be disposed or formed over the first shift region 90 and the second shift region 100, and over or in the variable region 80, with an upper planar layer of conductive material or RDLs 130 formed over the insulating layer 77 and without a valley, trough, rippling, or sloped upper surface contours 78, as shown FIG. 4C, the conductive material 130 being supported and formed over the metal fill. A lower surface of the insulating layer may be in contact with the unique electrically conductive pattern 130 and over the variable metal fill 110. An upper surface of the insulating layer 77 opposite the lower surface of the insulating layer 77 is substantially planar, such that topography effects are minimized, such as for an upper RDL 130. For example, the upper surface of the insulating layer 77 may vary in elevation less than a typical range, such as 1 to 10 μm or variation, or less than a thickness of the insulating layer.

FIG. 4C illustrates a cross-sectional side or profile view similar to that of FIG. 4B. FIG. 4C differs from FIG. 4B by the omission of the variable metal fill 110. The insulating layer 77 may be disposed or formed over the first shift region 90 and the second shift region 100, and within the variable region 80 forming the valley, trough, or sloped upper surface contours 78, because of the omission of metal fill 110. An upper layer of conductive material or RDLs 130 is shown following the valley, 78 of the insulating layer 77.

As noted above, and as shown, e.g., in FIG. 4C, spaces, gaps, or offsets between variable metal fill 110 can create an uneven surface, such as for insulating layer 77, which can include photosensitive, polymer material, or polymer layer "PM". The uneven surface can cause breaks in the insulating layer 77, in variable metal fill 110, and with conductive material (including RDLs) 130 that can lead to yield loss in manufacturing. Such defects reduce production yield, contrary to the goal of improving production yield. Stated another way, building a conductive material 130 (such as traces or an RDL 130) on an uneven material layer, (like insulating layer 77), increases chances of producing RDL defects. Gaps in copper or other conductive material or features, including between traces, often result in valleys 78 in the PM layer. More generally, uneven metal density results in rippling 78 of the PM layer, which in turn results in defects in the layers above, thereby impacting final product yield.

Use of variable metal fill 110 can address the previous problem mentioned above, as well as assisting with other design rules such as planarization or plating. Designers also use metal fill for connections between die with custom geometry. This can be for power connections or other connections with specific geometry rules. Connections between die are not always traces, and some connections can be filled polygons. Die shift can occur in and around the areas where a designer wants variable metal fill 110. The final position of routes may be, and are often, not known at the time the designer determines metal fill.

As is described in greater detail herein, gaps between conductive material 130, such as unique traces can be advantageously filled in with unique variable metal fill 110 (including copper planes). See, e.g., FIGS. 5A-6C. Certain manufacturing processes may suggest or require variable metal fill 110 to meet metal density rules (e.g. planarization or plating). Variable metal fill 110 may comprise unique or custom shapes connected to other metal geometry. Under conventional processes and design rules, unique shapes, or Custom Shapes "CS" defined in real time or in response to shift (also known under the trademark or service mark "Adaptive Shapes"™ "ASTM"™) will not connect to any metal it is not explicitly connected to. Conventionally, variable metal fill 110 was not known or used to connect to unique traces, or custom traces or custom routing (e.g., "Adaptive Routing"™ metal).

Figure 5A:
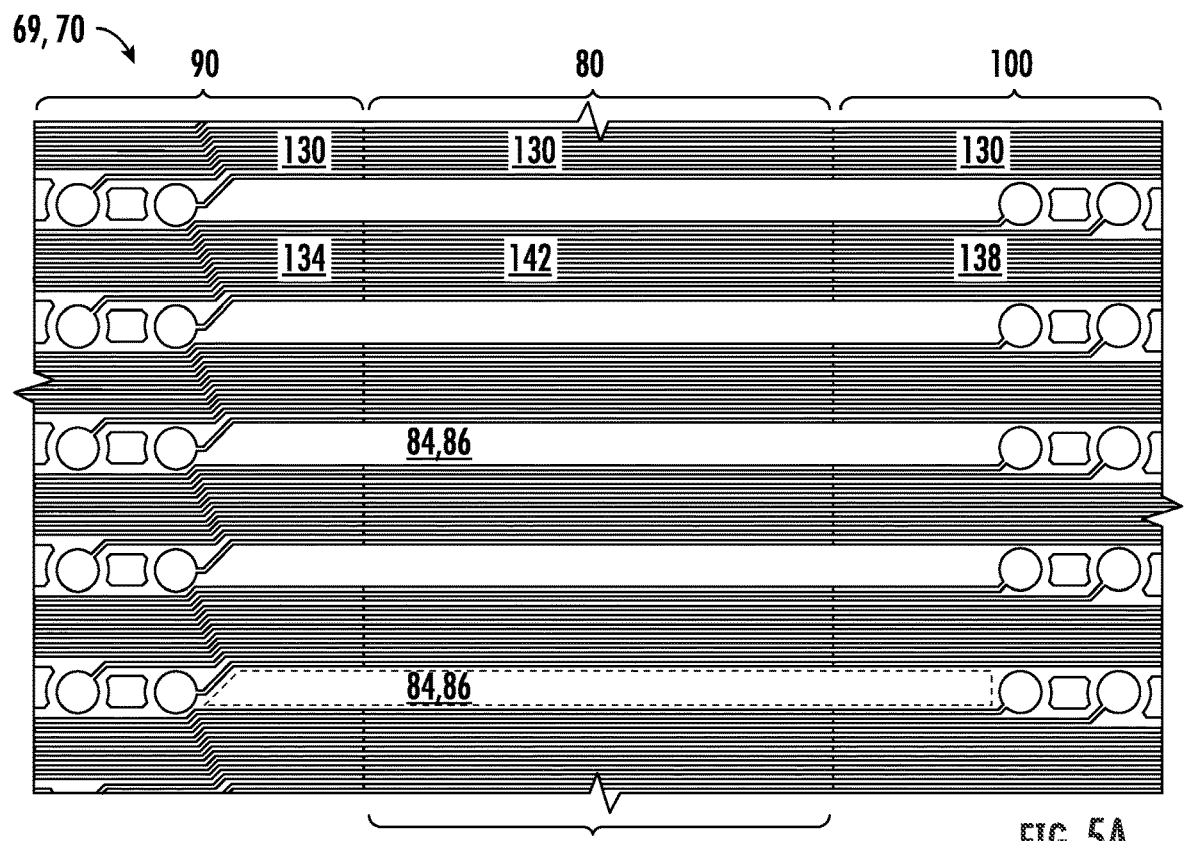
FIGS. 5A-5C illustrate additional views of conductive material, e.g. traces, formed in a variable region, a first shift region, and a second shift region.
Figure 5B:
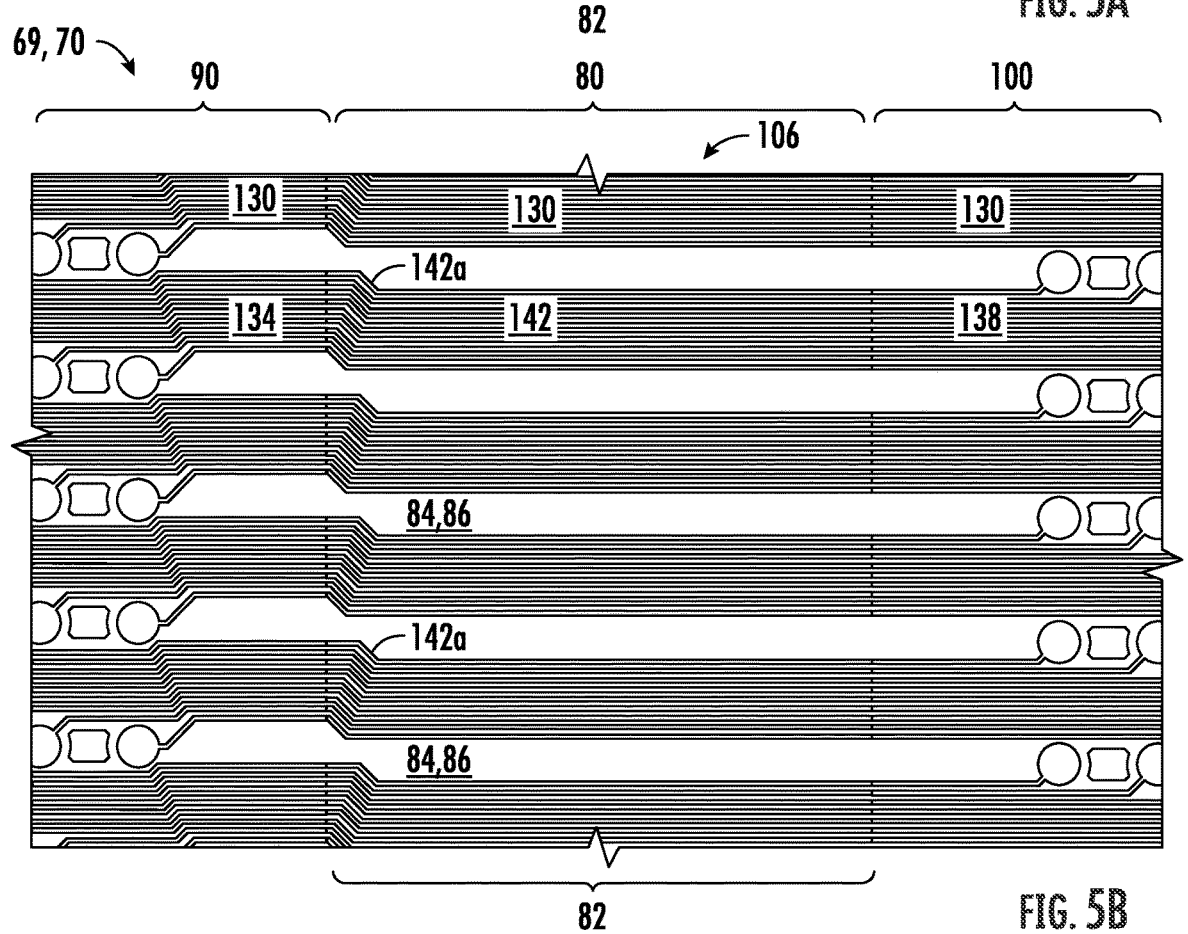
Figure 5C:
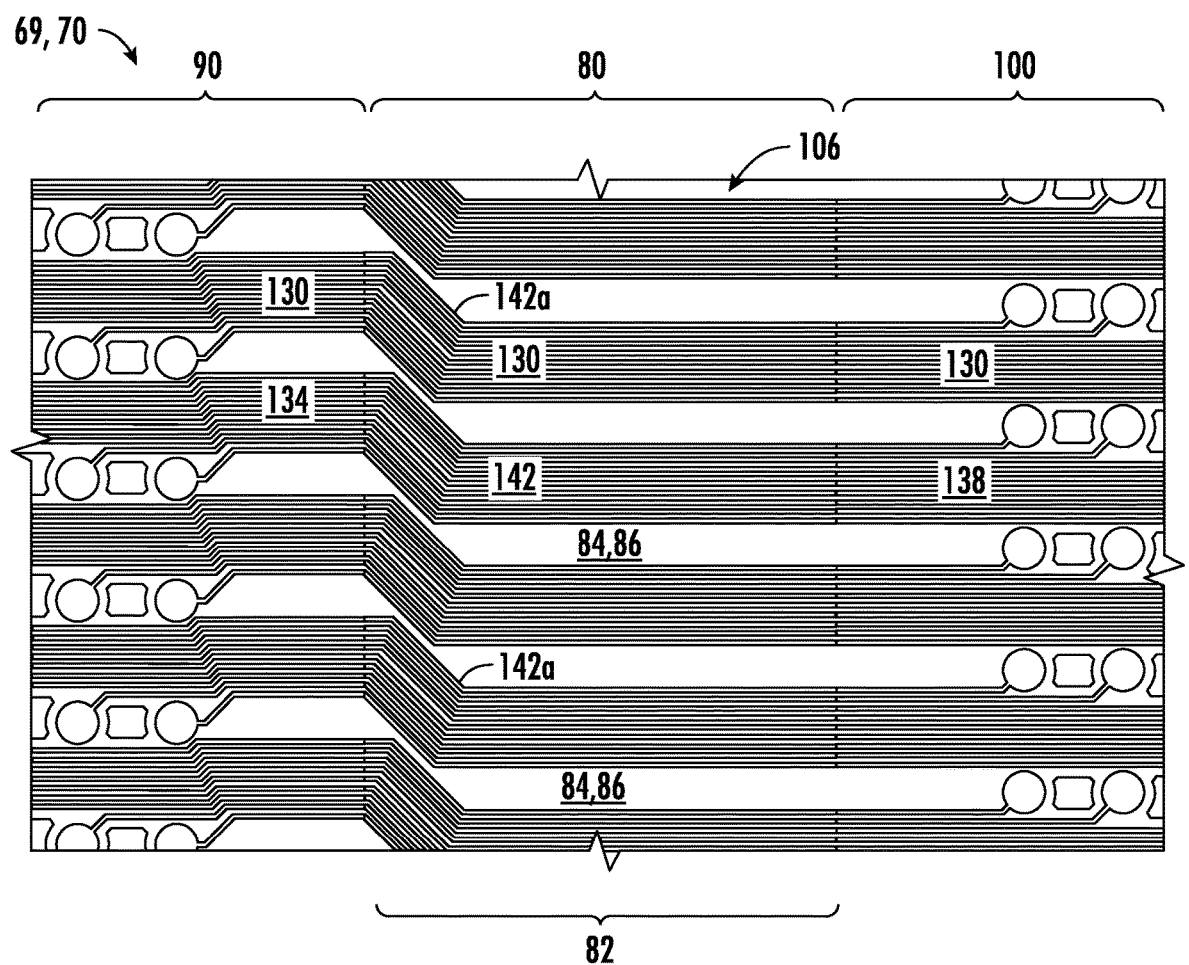

FIGS. 5A-5C illustrate additional views of conductive material 130, e.g. traces, formed in a variable region 80, a first shift region 90, and a second shift region 100. FIG. 5A illustrates the conductive material 130 comprising a first portion 134 a second portion, and a third portion 142. The first portion 134 is disposed in the first shift region 90, the second portion 138 is disposed in the second shift region 100, and the third portion 142 extend to, and couples with, the first portion 134 and the second portion 138. FIG. 5A illustrates a case in which there is little or no appreciable shift in the first shift region 90 and the second shift region 100, so that the conductive material 130 may be formed without any variation, customization, or adapting, from an original design. FIG. 5A illustrates an instance in which any shift is within a tolerance of the design for formation of subsequent features, such as conductive material 130.

FIG. 5B, similar to FIG. 5A, illustrates a view of conductive material 130, e.g. traces, formed in a variable region 80, a first shift region 90, and a second shift region 100. The conductive material 130 comprising the first portion 134 disposed in the first shift region 90, the second portion 138 disposed in the second shift region 100, and the third portion 142 extending to, and coupled with, the first portion 134 and the second portion 138. FIG. 5B illustrates a case in which there is appreciable shift in the first shift region 90, the second shift region 100, or both, so that the design and structure of the third portion 142 is formed with variation, customization, or adapting, 142a from an original design to account for the shift.

FIG. 5C, similar to FIG. 5B, illustrates a view of conductive material 130, e.g. traces, formed in a variable region 80, a first shift region 90, and a second shift region 100. The conductive material 130 comprising the first portion 134 disposed in the first shift region 90, the second portion 138 disposed in the second shift region 100, and the third portion 142 extending to, and coupled with, the first portion 134 and the second portion 138. FIG. 5C illustrates a case in which there is even more of an appreciable shift than was shown in FIG. 5B, which results in a greater change to the design and structure of the third portion 142 to include variation, customization, or adapting, 142a from an original design to account for the shift.

Figure 6A:
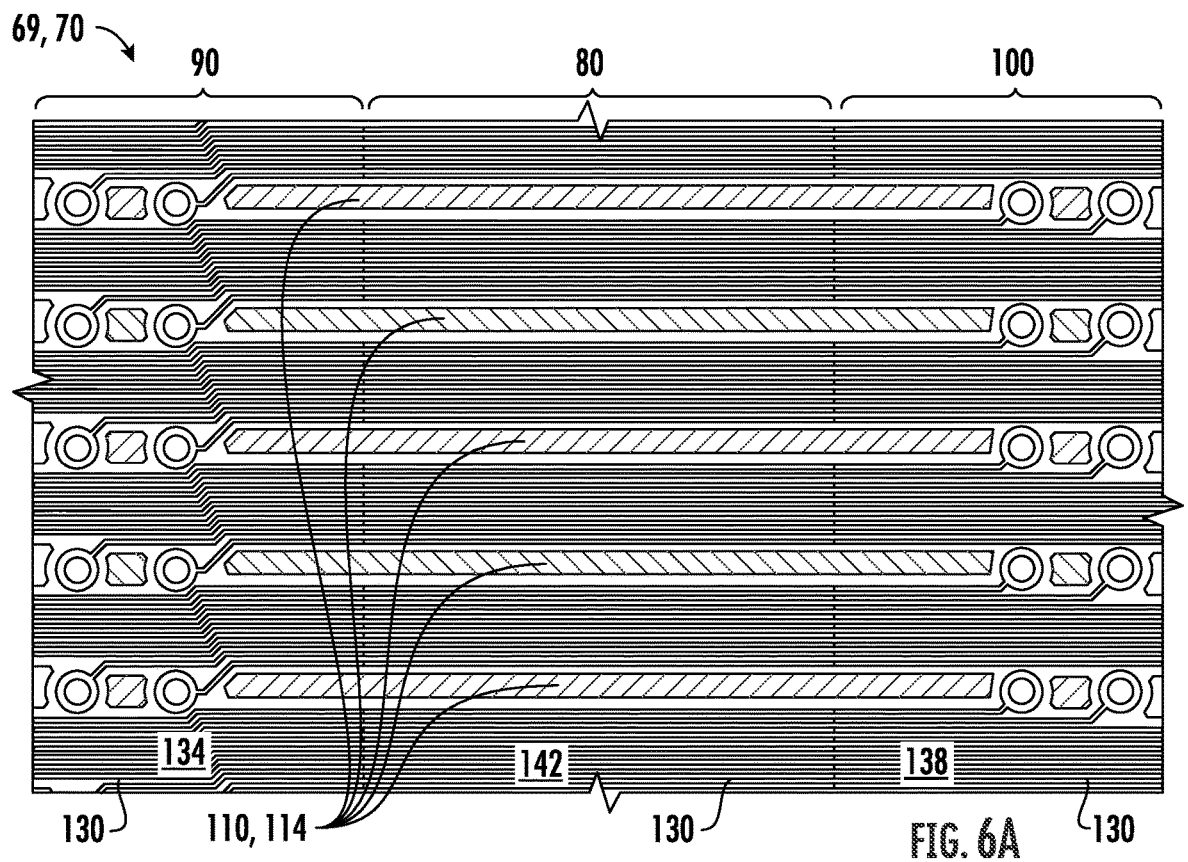
FIGS. 6A-6C illustrate additional views of variable metal fill (VMF) formed in a variable region, a first shift region, and a second shift region.
Figure 6B:
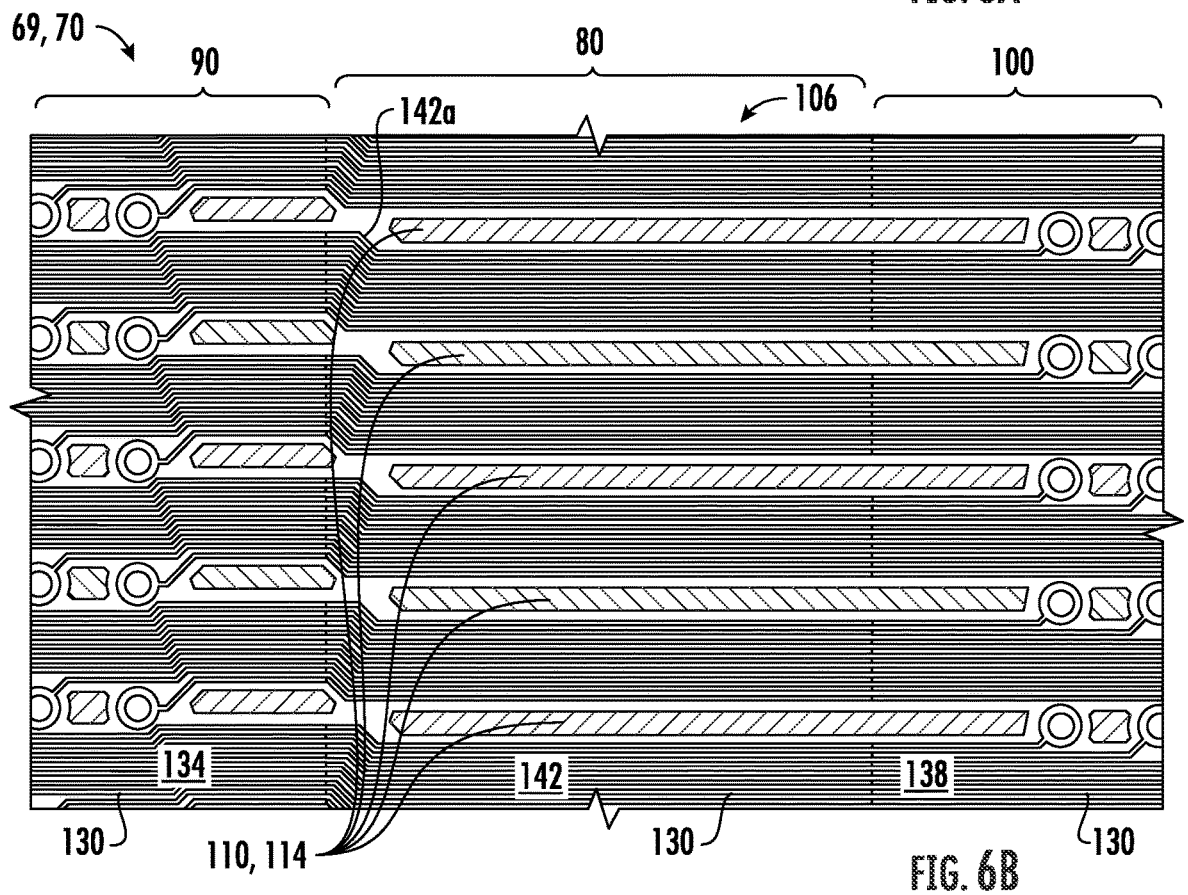
Figure 6C:
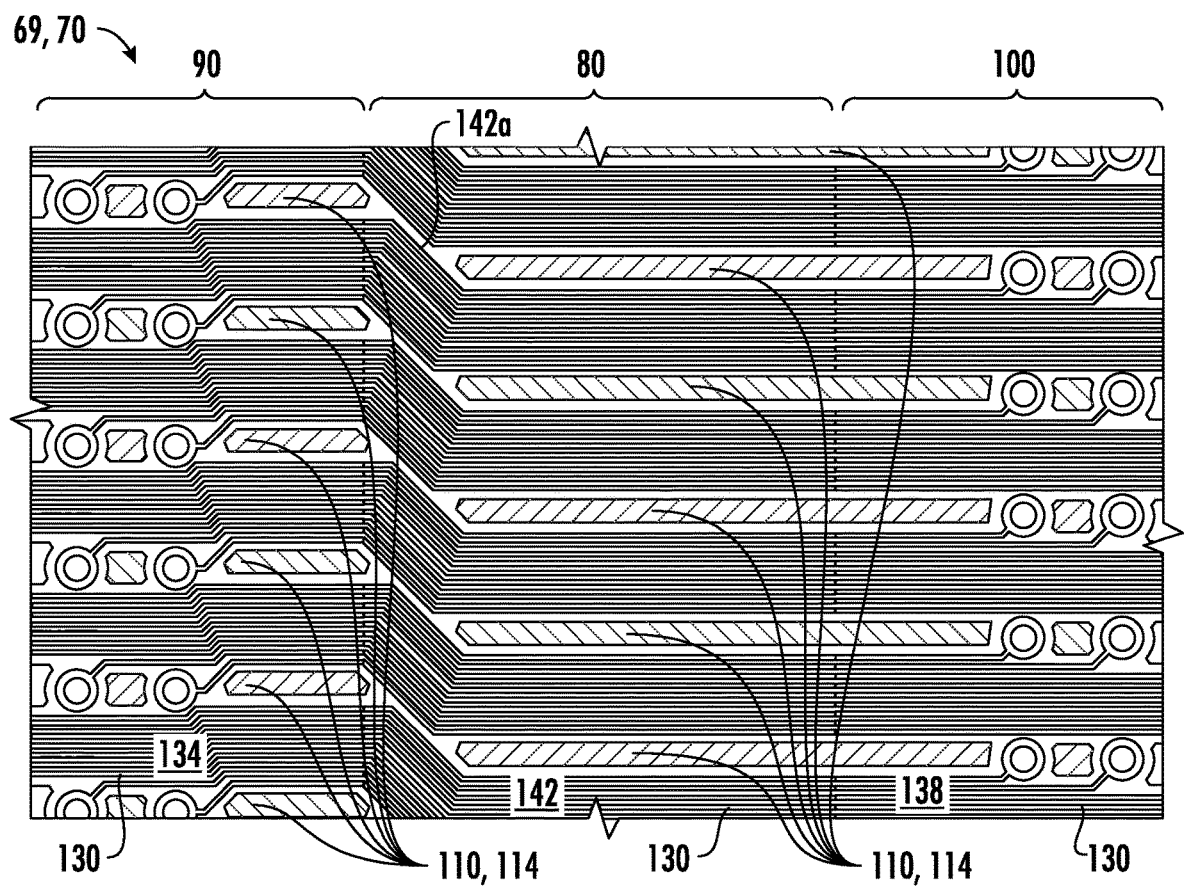

FIG. 6A-6C correspond to FIGS. 5A-5C, respectively, and show a same structure but with an addition of variable metal fill 110, which can reduce unwanted valleys 78. Variable metal fill 110 is shown as being solid 114, or without a fill pattern 118, although in other instances the variable metal fill 110 could be formed with a fill pattern 118, as discussed below with respect to other FIGs. The variable metal fill 110 can be formed in fill area 84, as well as in a routing relief area 86. The routing relief area 86 may be formed to provide space for larger or smaller variations 142a in conductive material 130. The routing relief area may be coextensive with the fill area 84 when there is no shift or before shift occurs. The routing relief area that is filled with variation 142 may be a smaller subset of the routing area 82 which then leaves place for the fill area 84, in to which variable metal fill 110 is deposited. In some instances the routing relief area 86 between traces or conductive material 130 can become a fill area 84. As shown in FIG. 6A, the variable metal fill 110 may be continuous, or separated into separate portions or islands as shown in FIGS. 6B and 6C.

Figure 7A:
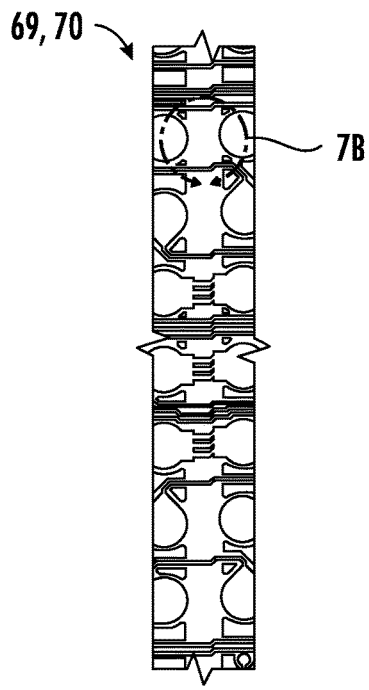
FIGS. 7A-7D illustrate additional enlarged views of variable metal fill.
Figure 7B:
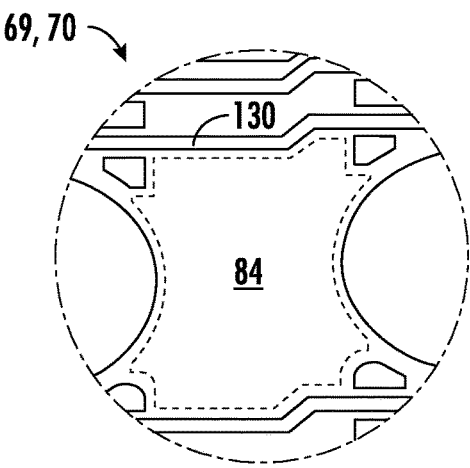
Figure 7C:
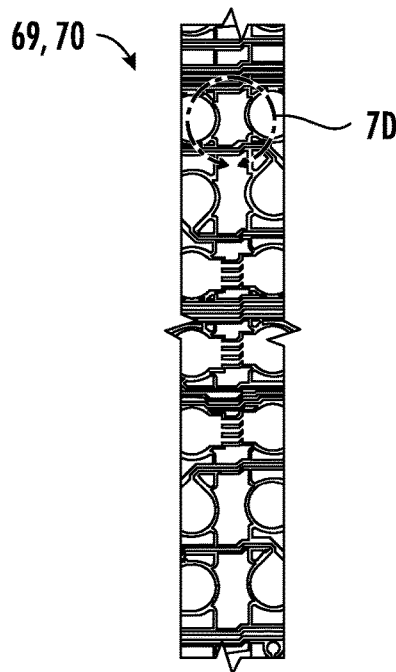
Figure 7D:
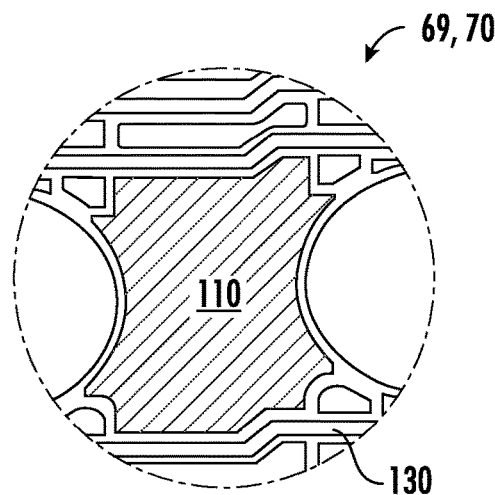

FIG. 7A illustrates a plan view of a portion of a semiconductor device 69 or substrate 70. FIG. 7B illustrates a close-up view of the portion of the semiconductor device 69 or substrate 70 illustrated by the section line 7B in FIG. 7A. FIG. 7B illustrates an example of a fill area 84, into which the variable metal fill 110 may be subsequently formed. FIGS. 7C and 7D illustrate the fill area 84 being filled with variable metal fill 110. The fill area 84 may be defined by one or more areas defined by four corners or other shape. There may be multiple fill areas 84 designated across a surface or level of the semiconductor device 69 or substrate 70.

The outlines of the adaptive metal fill areas 84 may be formed of one or more corners, points, curves, arcs, line segments, or any other suitable geometric, or organic form. For semiconductor devices 69 comprising a lot of 30 or more of the semiconductor devices 69 (or other similar suitable or statistically significant number), differences among outlines of the unique variable metal fill 110 areas will be more than typical manufacturer tolerances, such as greater than 30% more (or other similar suitable or statistically significant number, percentage, or number or portion of standard deviations).

Figure 8A:
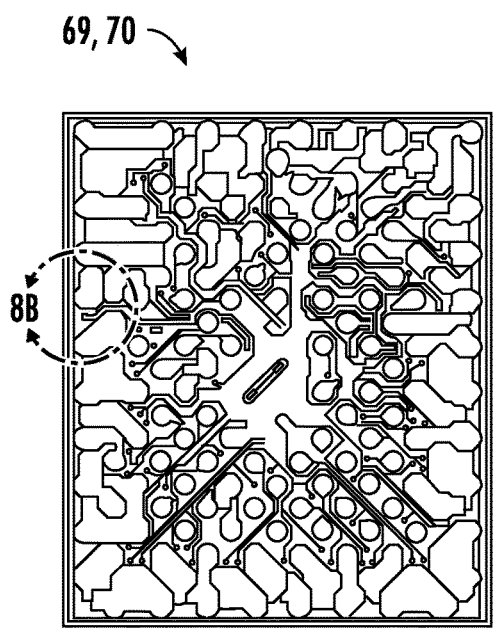
FIGS. 8A-8H illustrate various aspects of variable metal fill.
Figure 8B:
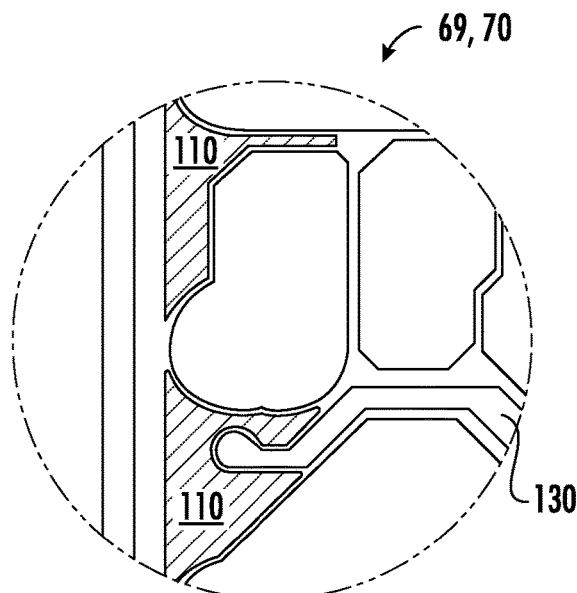
Figure 8C:
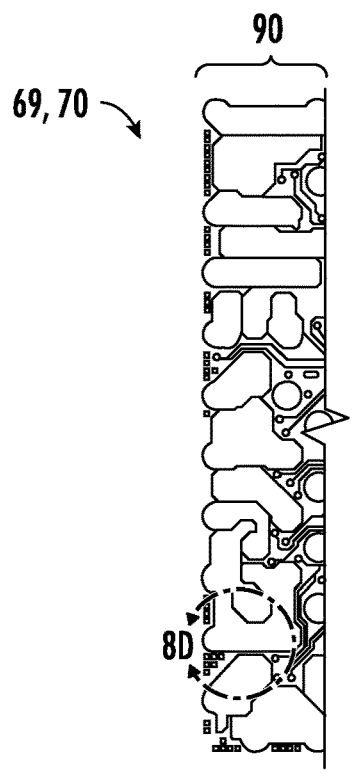
Figure 8D:
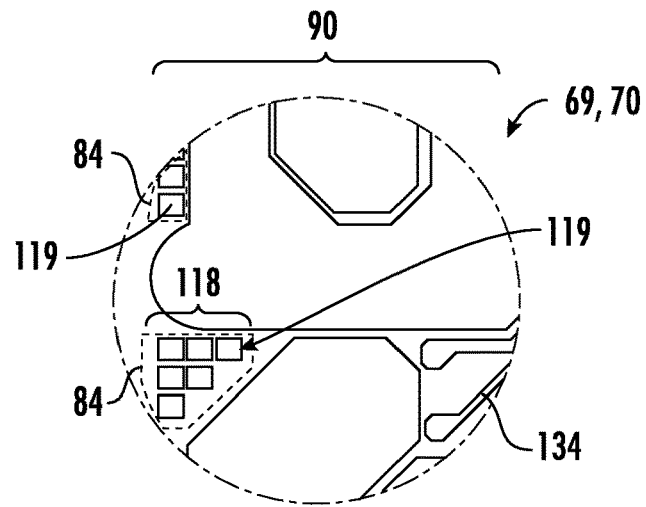

FIG. 8A illustrates a plan view of a portion of a semiconductor device 69 or substrate 70. FIG. 8B illustrates a close-up view of the portion of the semiconductor device 69 or substrate 70 illustrated by the section line 8B in FIG. 8A. FIG. 8B illustrates an example of the variable metal fill 110 formed at an edge of the semiconductor device 69 or substrate 70. FIGS. 8C and 8D illustrate the fill area 84 being filled with variable metal fill 110.

FIG. 8C illustrates a plan view of a portion of a semiconductor device 69 or substrate 70. FIG. 8D illustrates a close-up view of the portion of the semiconductor device 69 or substrate 70 illustrated by the section line 8D in FIG. 8C. FIG. 8D illustrates an example of the variable metal fill 110 being as a pattern 118, comprising a number of shapes, objects, or tiles 119 that are formed within fill areas 84 on or over the semiconductor device 69 or substrate 70. The tiles 119, 119a, and 119b may be defined by any shape, such as by a square, rectangle, or any regular or irregular polygon or geometric shape. In some instances, a lateral offset between the electrically conductive pattern of traces 130 and the unique variable metal fill 110 is less than 1-50%, 10-20%, 30%, or 1 standard deviation of an offset between a side of the first embedded device 14 and a side of the semiconductor device or package 69.

Figure 8E:
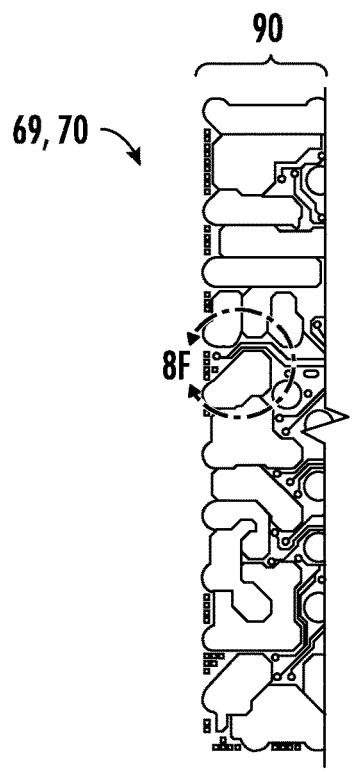
Figure 8F:
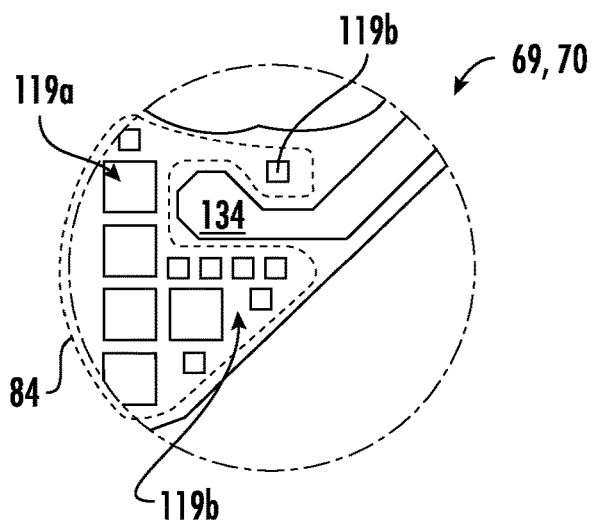

FIG. 8E illustrates a plan view of a portion of a semiconductor device 69 or substrate 70. FIG. 8F illustrates a close-up view of the portion of the semiconductor device 69 or substrate 70 illustrated by the section line 8F in FIG. 8E. FIG. 8F illustrates an example of the variable metal fill 110 being as a pattern 118. Pattern 118 may comprise a number of shapes, objects, or tiles 119 that are formed within fill areas 84 on, over, or within layers of the semiconductor device 69 or substrate 70. The pattern 118 in FIG. 8F varies from that of FIG. 8D, by including shapes, objects, or tiles of different sizes 119a and 119b. FIG. 8F shows how fill areas may be defined by placement of larger shapes 119a and the placement of smaller shapes 119b adjacent to those larger shapes 119a. While two different sizes are shown, any number of different sized shapes or tiles 119 may be used.

Figure 8G:
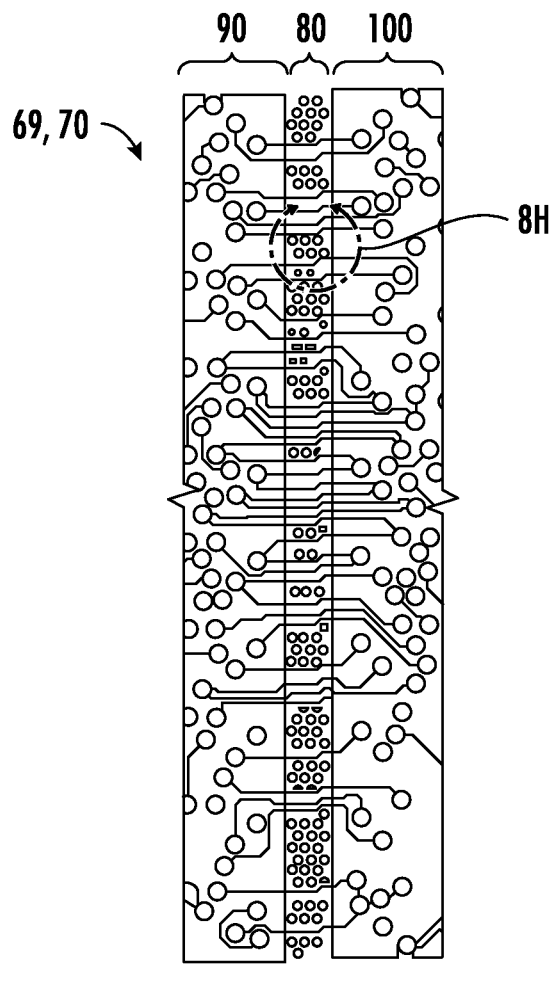
Figure 8H:
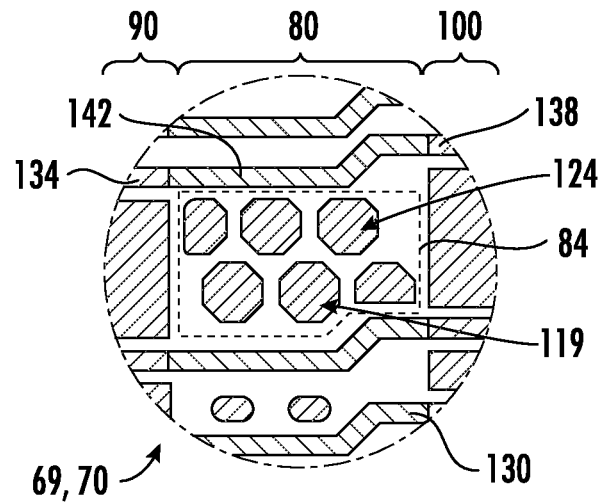

FIG. 8G illustrates a plan view of a portion of a semiconductor device 69 or substrate 70. FIG. 8F illustrates a close-up view of the portion of the semiconductor device 69 or substrate 70 illustrated by the section line 8F in FIG. 8G. FIG. 8F illustrates an example of the variable metal fill 110 being formed with, or as, a pattern 118. Pattern 118 may comprise a number of shapes, objects, or tiles 119 that are formed within fill areas 84 on, over, or within layers of the semiconductor device 69 or substrate 70. The pattern 118 further comprises tiles 119 may be defined by shape trimming, which includes beginning with the tile 119 having any starting shape that is then modified, adjusted, or trimmed in shape (removing a portion thereof) to accommodate the outline, shape, or profile it is filling. Thus, in a design space an entire shape, such as a full octagon comprising a diameter of 50 μm may be modified, trimmed, or clipped before being formed in physical space as a clipped element 124.

Accordingly, the variable region 80 may comprise a unique variable metal fill 110, wherein the unique variable metal fill 110 is electrically isolated from the unique electrically conductive pattern 130. In other instances, portions of the conductive material 130 may also comprise any of the solid 114 or patterned 118 fill comprising tiles 119, 119*a*, 119*b*, and 124, described above. In some instances, a portion of the variable region 80 may be filled with variable metal fill 110 using "stitching" or multiple "lines" or "stitches", that like conventional traces of a standard thickness connect two objects or areas with lines or stitches of a standard length. The stitching may produce open or empty areas where no metal fill is placed within the metal fill area 110.

The boundary of adaptive metal fill area 84 may also serve as an outline for a unique non-conductive metal fill area 110. In other instances, a total outer perimeter or outline (that is the entire metal fill area 84) may comprise the outline of the adaptive metal fill area. The outline may be formed of one or more corners, points, curves, arcs, line segments, or any other suitable geometric, or organic form. For semiconductor devices comprising a lot of 30 or more of the semiconductor devices (or other similar suitable or statistically significant number), differences among outlines of the unique variable metal fills 110 (adaptive metal fill regions/areas) will be more than typical manufacturer tolerances, such as greater than 30% more (or other similar suitable or statistically significant number, percentage, or number or portion of standard deviations).

Figure 9A:
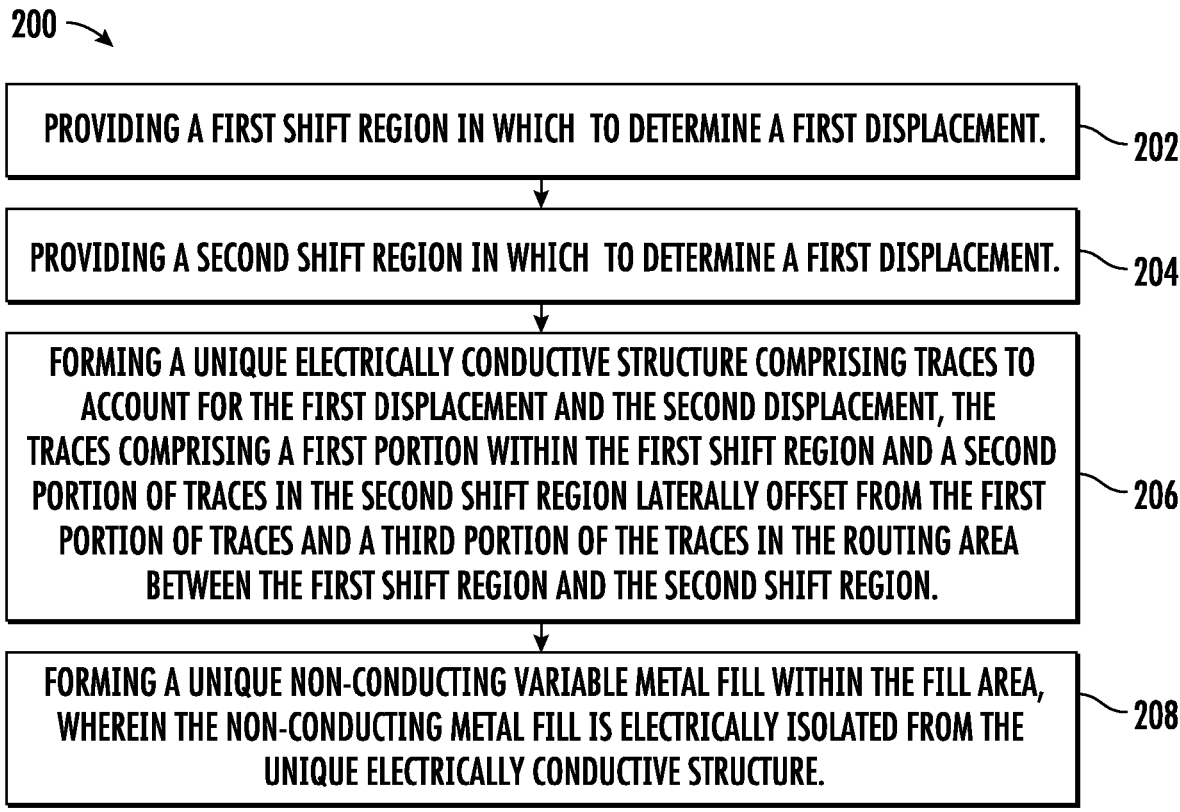
FIGS. 9A and 9B illustrate flow charts for methods of forming variable metal fill.
Figure 9B:
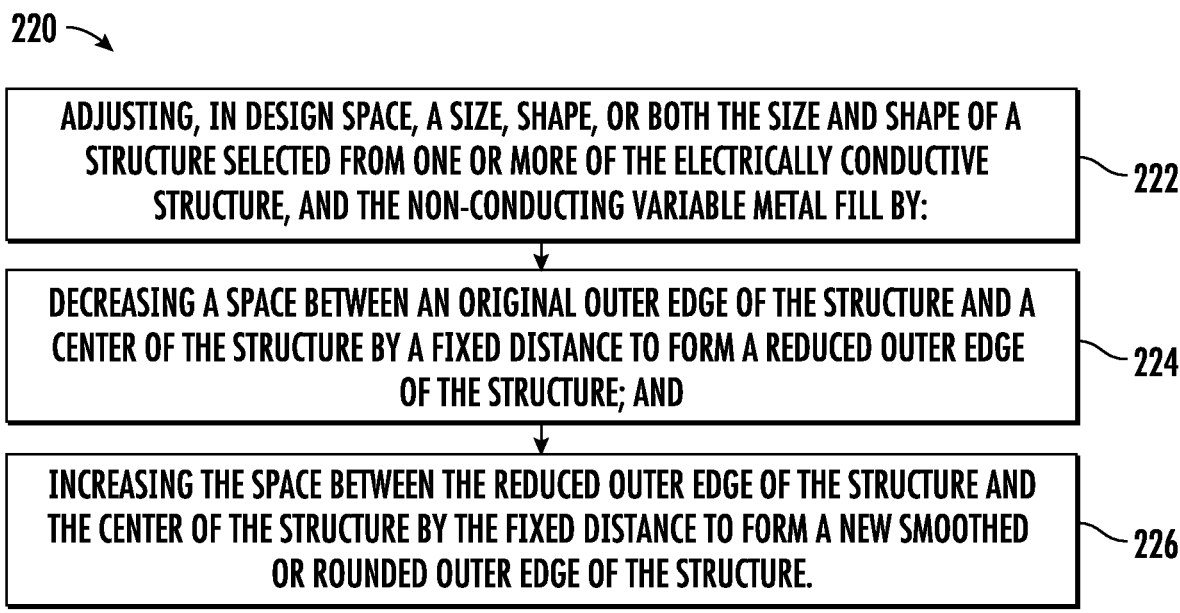

FIGS. 9A and 9B illustrate flowcharts or wireframes of various methods that may be used in implementing unit specific variable metal fill as described herein. The flowchart or wireframe 200 of FIG. 9A includes element 202 which provides for providing a first shift region 90 in which to determine a first displacement. Element 204 provides for providing a second shift region 100 in which to determine a first displacement. Element 206 provides for forming a unique electrically conductive structure 130 comprising traces to account for the first displacement and the second displacement, traces comprising a first portion 134 within the first shift region 90 and a second portion 138 of traces in the second shift region 100 laterally offset from the first portion 134 of traces and a third portion 142 of the traces in the routing area 82 between the first shift region 90 and the second shift region 100. Element 208 provides for forming a unique non-conducting variable metal fill 110 within the fill area 84, wherein the non-conducting metal fill 110 is electrically isolated from the unique electrically conductive structure 130.

The method for unit specific metal fill 200 may comprise forming a unique electrically conductive pattern of traces 130 and a unique non-conductive metal fill 110 that is not electrically coupled with an electrical current and provides structural support, such as to prevent valleys 78. First, in terms of a design phase, a designer can create a variable region 80 for conductive material 130, including custom or unique RDLs, traces, or routing. The variable region 80 can handle wide traces as well as traces with varied widths without the designer actively needing to make changes.

A custom patterning Studio "CP Studio" electronic design automation (EDA) software (such as the CP Studio known under the trademark "AP Studio") may be used to clip all metal in a variable region 80. CP Studio may calculate or let an engineer create the Custom Routing Region (CCR) for traces that cross through the variable region and a connectivity list for traces within. CP Studio may create a connected variable metal fill region 110 if ends of features do not have a same width, or if the width exceeds the threshold for a normal trace. CP Studio may pass the Custom Routing Region (CRR) connectivity list and variable metal fill region 110 on for the Custom Patterning Engine "CP Engine" (which includes a CP Engine under the trademark or service mark "AP Engine™" to adapt. Ends of the variable metal fill 110 may move with the shift regions 90, 100 they are in or are associated with. Variable metal fill 110 points between shift regions 90, 100 may remain fixed in place. Custom routing may take place. Connected fill areas 84 are filled to form variable metal fill areas 110. Unconnected fill areas 84 are filled to form variable metal fill areas 110.

The flowchart or wireframe relates to a method 220 of FIG. 9B includes element 222 which provides for adjusting, in design space, a size, shape, or both the size and shape of a structure selected from one or more of the electrically conductive structure 130, and the non-conducting variable metal fill 110. Element 224 provides for decreasing a space between an original outer edge of the structure and a center of the structure by a fixed distance to form a reduced outer edge of the structure. Element 226 provides for increasing the space between the reduced outer edge of the structure and the center of the structure by the fixed distance to form a new smoothed or rounded outer edge of the structure.

Accordingly, the method 220 of FIG. 9B relates to examples of adjusting, in design space, a size, shape, or both the size and shape of a structure selected from one or more of the conductive material 130, such as a patterned trace, and the variable metal fill 110 (which in some instances is referred to by the trademark or service mark "Sanding™".

In some instances, two metal bodies, an upper body and a lower body, may become inadvertently connected by a narrow strip or isthmus of material, such as in design space. In design space, by decreasing a distance between an outer edge and a center portion by a distance greater than half the total size or width of the narrow strip or isthmus, the size of the narrow strip or isthmus goes to 0, and thus is removed and not present for the increasing step. As a result, the upper body and lower body may be no longer connected in design space, as desired, and may be so created or built in real space.

In other instances, a rectangular feature can undergo the decreasing step to move from the outer size to the nested inner size, which may occur by moving points inwards from the corners of the rectangular features. With the increasing step, the increasing progresses from the smaller corners to create a larger rounded corner. Thus, the new outer edge of the rectangular line may be the same along most of its length with the original outer edge, but with rounded corners.

In yet other instances, a small organically shaped feature with a width less than the decreasing step causes the entire feature to be removed by going to zero and having no point, area, or edge from which to increase or expand. As a size of the decreasing step has a greater magnitude, more features will be removed, erased, or "sanded"™ away.

Advantages of the variable metal fill 110 improves over conventional custom routing. Custom routing is limited by using stitching implementations (connecting features of a same size) for shapes in a variable region 80. Stitching limits the flexibility since both ends of the shape in the variable region 80 must be the same size and the connections between are made up of many smaller traces (conventional custom routing cannot route traces that don't terminate with the same width). By creating custom routing regions, custom shapes and custom fills allow for: (i) features of different sizes to be connected and (ii) for structurally supporting non-conductive features (unique variable metal fill 1101 to be laterally offset from the unique electrically conductive pattern of traces (CP), wherein the unique variable metal fill 110 is electrically isolated from the unique electrically conductive pattern.

The variable metal fill 110 described herein may be detected in a final semiconductor device or package in a number of ways; and, which include examining a single device or package as well as examining a number of semiconductor devices or packages from a same lot or group of devices. Detection may be made based on: (i) observing or measuring an embedded device being offset from a device edge or package edge, but with the vias still being aligned with the interconnects of the embedded device, (ii) observing or measuring lithography misalignment is independent of embedded device misalignment, (iii) observing or measuring that an embedded device has shifted, a pattern has shifted with it, and the shift of the die is more than the gap or shift between the inert metal between shifted metal patterns (the unique variable metal fill 110 to be laterally offset from the unique electrically conductive pattern of traces), and shift is design specific, and may be on the order 2-100 µm, 5-50 µm, or about 30 µm of die shift for 2 µm lines and 2 µm space RDLs or traces coupled with the embedded devices, (iv) within a lot of 30 devices or more, the fill metal pattern differences are more than typical manufacturer tolerance/differences, and are greater than 1-50%, 10-20%, or 30% different, as well as manufacturer tolerance/differences greater than 1 standard deviation, and (v) portions of a variable region 80 (such as for variable metal fill 110 and for conductive material 130) are present or not present (different) for a single lot and a single variable region 80 design.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of forming an electronic product, comprising:
providing a temporary carrier;
disposing a first device comprising first interconnects over the carrier;
disposing a second device comprising second interconnects over the carrier laterally offset from the first device;
disposing encapsulant over and around the first device and the second device to form a first embedded device comprising a first shift region and a second embedded device comprising a second shift region;
measuring a displacement of the first embedded device within the first shift region to determine a first displacement;
measuring a displacement of the second embedded device within the second shift region to determine a second displacement;
forming a variable region between and extending to the first shift region and the second shift region, the variable region further comprising a routing area, a relief area, and a fill area;
forming a unique electrically conductive structure comprising traces to account for the first displacement and the second displacement, the traces comprising a first portion within the first shift region and a second portion of traces in the second shift region laterally offset from the first portion of traces and a third portion of the traces in the routing area between the first shift region and the second shift region;
forming a unique non-conducting variable metal fill within the fill area, wherein the non-conducting variable metal fill is disposed laterally between the first portion of traces and the second portion of traces and is electrically isolated from the unique electrically conductive structure; and
forming an insulating layer over the unique electrically conductive structure comprising traces and over the non-conducting variable metal fill.

2. The method of claim 1, wherein the insulating layer further comprises:
a lower surface in contact with the unique electrically conductive structure comprising traces and over the non-conducting variable metal fill; and
an upper surface of the insulating layer opposite the lower surface of the insulating layer, wherein the upper surface is substantially planar, such that the upper surface of the insulating varies in elevation less than 10 µm or less than a thickness of the insulating layer.

3. The method of claim 1, wherein the non-conducting variable metal fill is formed of a solid continuous material.

4. The method of claim 1, wherein the non-conducting variable metal fill is formed of patterned non-continuous material comprising tiles and gaps between the tiles of the metal fill.

5. The method of claim 1, wherein the fill area extends beyond the variable region into the first shift region, the second shift region, or both.

6. The method of claim 1, further comprising adjusting, in design space, a size, shape, or both the size and shape of a structure selected from one or more of the conductive patterned trace, and the non-conducting variable metal fill by:

decreasing a space between an original outer edge of the structure and a center of the structure by a fixed distance to form a reduced outer edge of the structure; and increasing the space between the reduced outer edge of the structure and the center of the structure by the fixed distance to form a new outer edge of the structure.

7. A method of forming an electronic product, comprising:

providing a first shift region in which to determine a first displacement;

providing a second shift region in which to determine a second displacement;

forming a unique electrically conductive structure comprising traces to account for the first displacement and the second displacement, the electrically conductive structure comprising traces comprising a first portion within the first shift region and a second portion of traces in the second shift region laterally offset from the first portion of traces and a third portion of the traces in the routing area between the first shift region and the second shift region; and forming a unique variable metal fill within the fill area, wherein the variable metal fill is electrically isolated from the unique electrically conductive structure.

8. The method of claim 7, further comprising forming an insulating layer over the unique electrically conductive structure comprising traces and over the variable metal fill disposed laterally between the first portion of traces and the second portion of traces.

9. The method of claim 8, wherein the insulating layer further comprises:

a lower surface in contact with the unique electrically conductive structure comprising traces and over the variable metal fill; and an upper surface of the insulating layer opposite the lower surface of the insulating layer, wherein the upper surface is substantially planar, such that the upper surface of the insulating varies in elevation less than 10 µm or less than a thickness of the insulating layer.

10. The method of claim 7, wherein the variable metal fill is formed of a solid continuous material.

11. The method of claim 7, wherein the variable metal fill is formed of patterned non-continuous material comprising tiles and gaps between the tiles of the metal fill.

12. The method of claim 7, wherein the unique electrically conductive structure comprising traces is electrically coupled to vias, under bump metallization (UBM) pads, or other electrically conductive structures.

13. The method of claim 7, further comprising adjusting, in design space, a size, shape, or both the size and shape of a structure selected from one or more of the conductive patterned trace, and the variable metal fill by:

decreasing a space between an original outer edge of the structure and a center of the structure by a fixed distance to form a reduced outer edge of the structure; and increasing the space between the reduced outer edge of the structure and the center of the structure by the fixed distance to form a new outer edge of the structure.

14. A method of forming an electronic product, comprising:

providing a first shift region in which to determine a first displacement;

forming a unique electrically conductive structure extending to the first shift region to account for the first displacement; and forming a unique variable metal fill, wherein the variable metal fill is electrically isolated from the unique electrically conductive structure.

15. The method of claim 14, further comprising forming an insulating layer over the unique electrically conductive structure comprising traces and over the variable metal fill.

16. The method of claim 15, wherein the insulating layer further comprises:

a lower surface in contact with the unique electrically conductive structure comprising traces and over the variable metal fill; and an upper surface of the insulating layer opposite the lower surface of the insulating layer, wherein the upper surface is substantially planar, such that the upper surface of the insulating varies in elevation less than 10 µm or less than a thickness of the insulating layer.

17. The method of claim 14, wherein the variable metal fill is formed as solid continuous material that extends to the first shift region and the second shift region to form a conductive feature.

18. The method of claim 14, wherein the variable metal fill is formed of patterned non-continuous material comprising tiles and gaps between the tiles of the metal fill.

19. The method of claim 14, wherein the unique electrically conductive structure comprising traces is electrically coupled to vias or vertical conductive interconnects, under bump metallization (UBM) pads, or other electrically conductive structures.

20. The method of claim 14, further comprising adjusting, in design space, a size, shape, or both the size and shape of a structure selected from one or more of the electrically conductive structure, and the variable metal fill by:

decreasing a space between an original outer edge of the structure and a center of the structure by a fixed distance to form a reduced outer edge of the structure; and increasing the space between the reduced outer edge of the structure and the center of the structure by the fixed distance to form a new outer edge of the structure.

* * * * *